United States Patent
Sharma et al.

(10) Patent No.: US 12,166,476 B2
(45) Date of Patent: Dec. 10, 2024

(54) HIGH VOLTAGE DEVICE WITH LINEARIZING FIELD PLATE CONFIGURATION

(71) Applicant: GlobalFoundries U.S. Inc., Malta, NY (US)

(72) Inventors: Santosh Sharma, Austin, TX (US); Johnatan Avraham Kantarovsky, South Burlington, VT (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 34 days.

(21) Appl. No.: 18/065,768

(22) Filed: Dec. 14, 2022

(65) Prior Publication Data

US 2024/0204764 A1 Jun. 20, 2024

(51) Int. Cl.
| | | |
|---|---|---|
| H03K 17/08 | (2006.01) | |
| H01L 29/40 | (2006.01) | |
| H01L 29/78 | (2006.01) | |

(52) U.S. Cl.
CPC .......... H03K 17/08 (2013.01); H01L 29/404 (2013.01); H01L 29/7816 (2013.01)

(58) Field of Classification Search
CPC ................. H03K 17/08; H03K 17/081; H03K 17/08104; H03K 17/0812; H03K 17/08122; H01L 29/404; H01L 29/7816; H01L 29/402
See application file for complete search history.

(56) References Cited

U.S. PATENT DOCUMENTS

| | | |
|---|---|---|
| 9,136,362 B2 | 9/2015 | Sakai et al. |
| 2007/0241368 A1 | 10/2007 | Mil'shtein et al. |
| 2007/0290762 A1 | 12/2007 | Lin et al. |
| 2014/0001515 A1 | 1/2014 | Kudymov |
| 2016/0225863 A1 | 8/2016 | Simin et al. |
| 2016/0380089 A1 | 12/2016 | Bahl et al. |

FOREIGN PATENT DOCUMENTS

WO 2021011163 A1 1/2021

OTHER PUBLICATIONS

European Search Report dated Feb. 27, 2024 for Application No. 23198237.2; pp. 8.

*Primary Examiner* — Jung Kim
(74) *Attorney, Agent, or Firm* — Francois Pagette; Hoffman Warnick LLC

(57) ABSTRACT

An integrated circuit (IC) having a high voltage semiconductor device with a plurality of field plates between the gate and drain. The IC further includes a biasing circuit electrically coupled to each of the plurality of field plates, the biasing circuit including a plurality of high voltage depletion mode transistors, each having a pinch off voltage. The high voltage depletion mode transistors may have different pinch off voltages, and each of the field plates are each independently biased by a different one of the high voltage depletion mode transistors.

16 Claims, 3 Drawing Sheets

HIGH VOLTAGE DEVICE WITH LINEARIZING FIELD PLATE CONFIGURATION

GOVERNMENT LICENSE RIGHTS

This invention was made with government support under contract HQ0727790700 awarded by the Defense Microelectronics Activity (DMEA)/Department of Defense (DoD). The government has certain rights in the invention.

BACKGROUND

The present disclosure relates to transistors and, more particularly, to a high voltage semiconductor device having multiple field plates and a biasing circuit to enhance the voltage field profile between the gate and drain of the device.

High voltage semiconductor devices are widely used in applications such as power switches and the like that handle high voltages, e.g., greater than 300V. In a typical high voltage device, the length between the gate and drain must be large enough to handle the electrical fields in both the on and off states. For instance, in the off state, a high voltage at the drain will create an electrical field between the gate and drain, which must not overwhelm the gate.

SUMMARY

All aspects, examples and features mentioned below can be combined in any technically possible way.

An aspect of the disclosure provides an integrated circuit (IC) that includes a semiconductor device having a gate and a drain and a plurality of field plates between the gate and drain. The IC further includes a biasing circuit electrically coupled to each of the plurality of field plates, wherein the biasing circuit includes a plurality of high voltage depletion mode transistors, each having a pinch off voltage.

Another aspect of the disclosure provides a biasing circuit for a semiconductor device having a plurality of field plates between a gate and a drain of the semiconductor device. The biasing circuit includes: a set of high voltage depletion mode transistors, each coupled to and biasing a respective field plate, and each having a different pinch-off voltage based on a distance of the respective field plate from the gate; and a set of resistors, each coupled between a source of the semiconductor device and a respective high voltage depletion mode transistor.

Another aspect of the disclosure provides a biasing circuit for a semiconductor device having a plurality of field plates between a gate and a drain of the semiconductor device. The biasing circuit includes: a set of high voltage depletion mode transistors, each coupled to and providing a biasing voltage to a respective field plate, wherein each high voltage depletion mode transistor has the same pinch-off voltage; and wherein each field plate is coupled to an adjacent field plate via a resistor to create different biasing voltages at each field plate.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
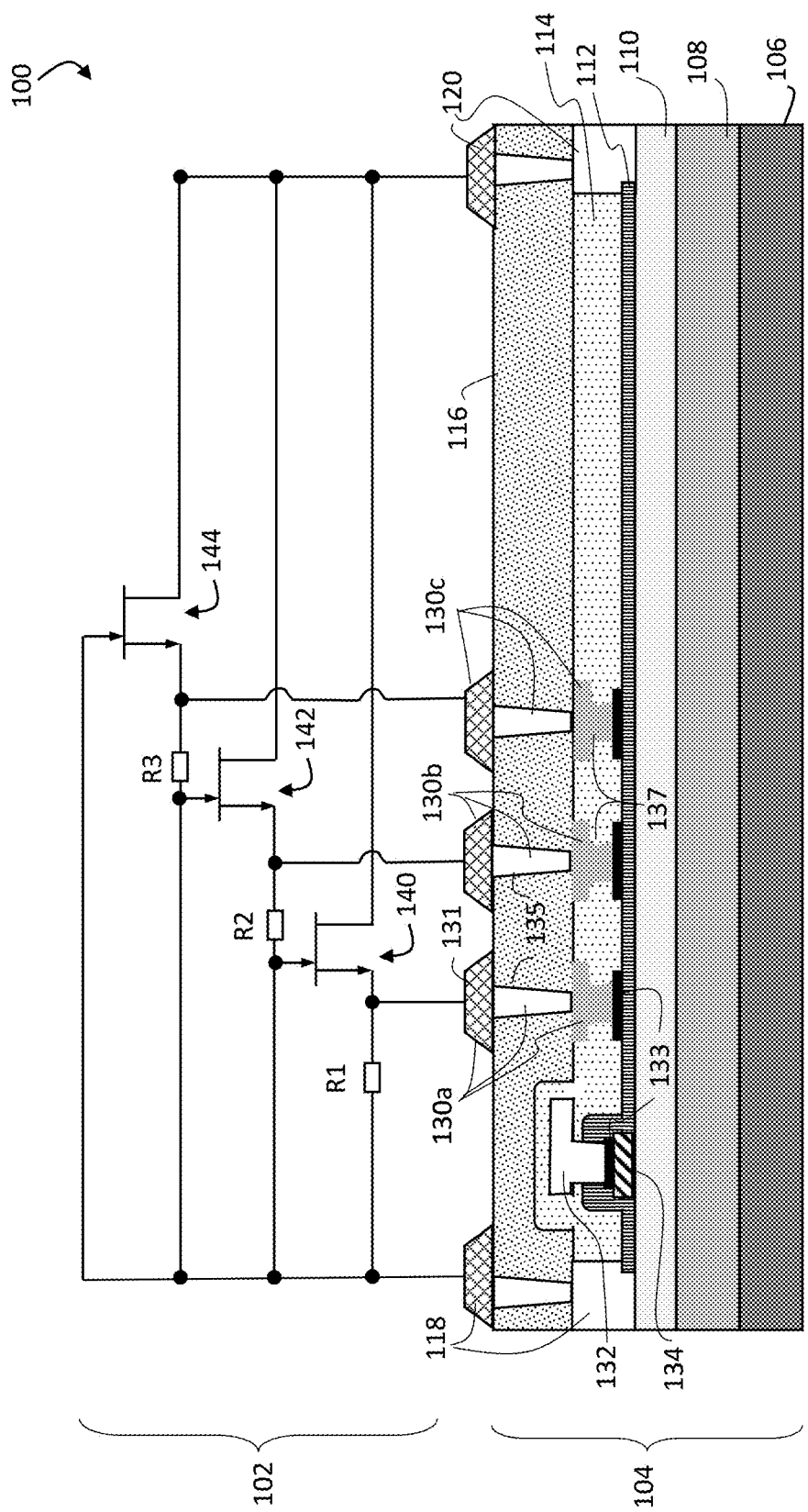
FIG. 1 shows a cross-sectional view of a structure having field plates and a biasing circuit, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit for a high voltage semiconductor device that includes: (1) a set of field plates fabricated between the gate and drain of the device, and (2) a biasing circuit electrically coupled to each of the field plates. The biasing circuit includes a set of depletion mode transistors having one or more pinch off voltages configured to independently bias the different field plates at the different pinch off voltages. In one aspect, the pinch off voltage applied to each of the field plates increases as their respective distance from the gate increases. The result is a more efficient device in which electric field stress points across the device are relieved, and a flatter linearized field profile across the device is provided.

FIG. 1 shows an integrated circuit 100 having a high voltage device 104 with field plates 130a, 130b, 130c and a biasing circuit 102. In this illustrative embodiment, the device 104 is an enhancement mode n-type device fabricated using gallium nitride (GaN). However, it is understood that the inventive aspects are not limited to a particular semiconductor technology and any other semiconductor technology could be utilized, e.g., silicon, germanium, etc. Accordingly, high voltage device 104 is described for illustrative purposes only, and other high voltage semiconductor devices fabricated with multiple field plates could be readily substituted.

In this embodiment, device 104 generally includes a p-type silicon layer or substrate 106, an epitaxially grown GaN channel/buffer layer 108, and aluminum GaN (AlGaN) barrier layer 110, a surface passivation layer (e.g., a thin dielectric) 112, and a second passivation layer 114. A gallium nitride gate 132 is formed in the second passivation layer 114 above a p-type GaN (pGaN) layer 134 and underneath a metallic layer 133. Metallic layer 133 may include, for example, a metal or metal alloy such as but not limited to titanium aluminum or titanium nitride, and an ohmic contact such as titanium nitride (TiN) or any other appropriate ohmic contact material. pGaN layer 134 may include, for example, p-type doped gallium nitride. The p-type dopant may include any appropriate p-type dopant for GaN such as but not limited to magnesium, zinc, cadmium and carbon.

A dielectric layer 116 is above the second passivation layer 114 and has interconnects (e.g., vias or metal wires) for the source 118 and drain 120. Passivation layers 112, 114 may include one or more layers of any appropriate passivation material such as but not limited to aluminum oxide (Al2O3), silicon nitride (Si3N4) and/or silicon oxide (SiOx).

A set of field plates 130a, 130b, 130c are provided between the gate 132 and drain 120. Each of the field plates 130a, 130b, 130c generally includes a 131, a via or interconnect 135 and a field plate structure 137. Field plate structures 137 are fabricated with a metal layer 133 close to the AlGaN barrier 110, and are separated by surface passivation layer 112. Contacts 131 of the field plates 130a, 130b, 130c reside on the surface of layer 116 and may be fabricated using a conductive material, e.g., metal such as tungsten. Vias 135 in layer 116 may include copper or aluminum. Field plate structures 137 in the surface passivation layer 112 (where gate 132 resides), may for example be composed of titanium nitride, titanium aluminum, tantalum nitride or polysilicon.

Although the device 104 is shown with three field plates, it is understood that fewer or more could be utilized. Furthermore, it is understood that the depicted size, location and shape of each field plate is not intended to be limiting, and any size, location or shape could be utilized. As is evident, fabrication of the field plates can be relatively simple, e.g., requiring a few simple processing steps.

In this embodiment, biasing circuit 102 includes three high voltage depletion mode transistors 140, 142 and 144, each having a different pinch-off voltage. For example, transistors 140, 142, 144 may have pinch off voltages of Vpinch1=20V, Vpinch2=40V, Vpinch3=60V, respectively. This thus provides 20V, 40V and 60V of biasing to field plates 130a, 130b, 130c, respectively. In this case, the pinch off voltage of each transistor 140, 142, 144 increases as the distance from the gate 132 increases, so transistor 140 has the lowest pinch off voltage and transistor 144 has the highest pinch off voltage, i.e., Vpinch1<Vpinch2<Vpinch3. Accordingly, each of the field plates is independently biased by high voltage depletion mode transistors In this embodiment, biasing circuit 102 also includes resistors R1, R2, and R3 to further bias the field plates. R1, R2, and R3 are coupled between a respective source of each transistor 140, 142, and 144 and the source 118 of device 104. In this embodiment, the total leakage current, which is limited by the Vpinch values, will be (Vpinch1/R1)+(Vpinch2/R2)+(Vpinch3/R3). This configuration accordingly provides a relatively low leakage current, e.g., better than that of a direct resistor divider.

Figure 2:
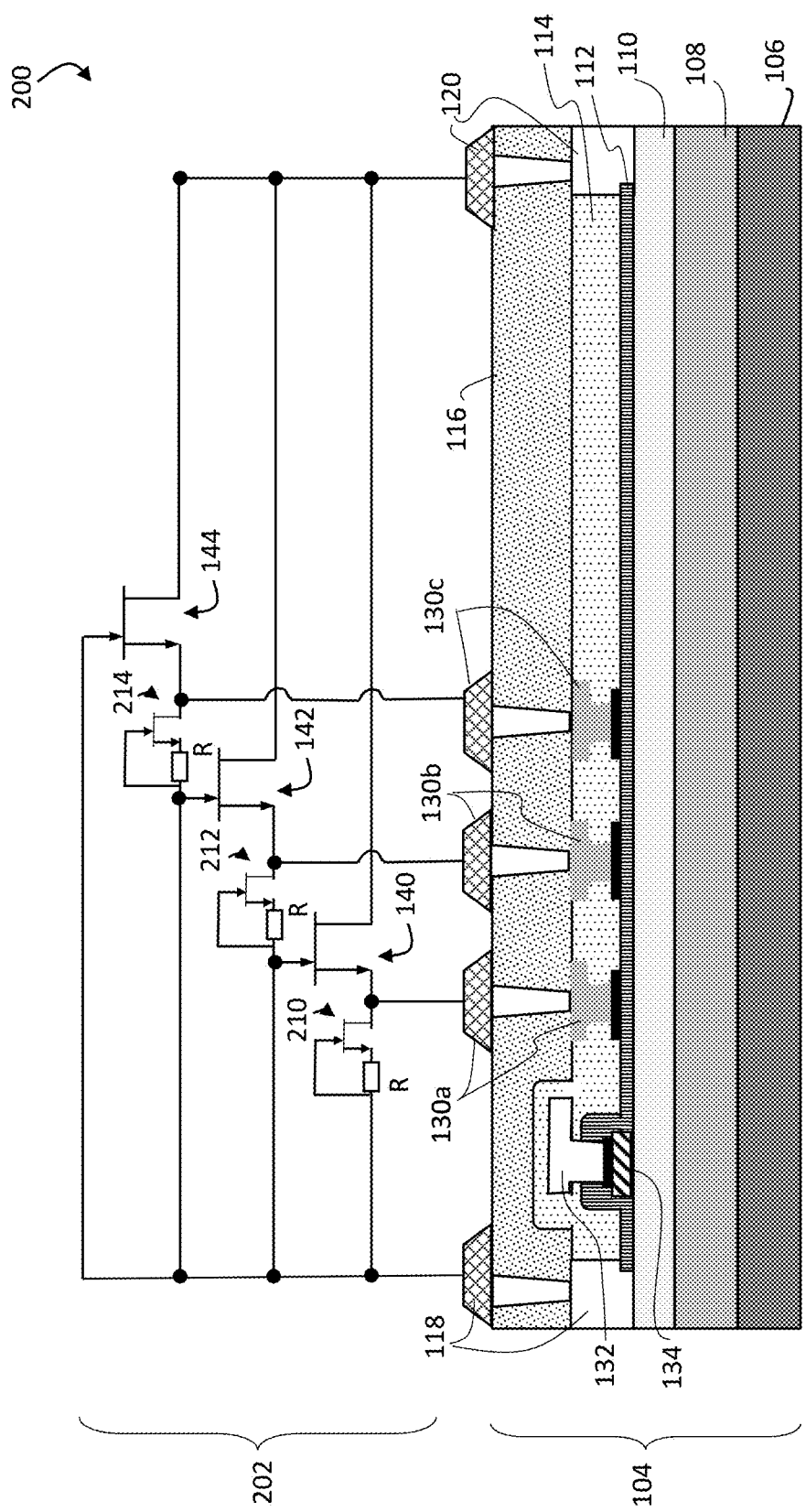
FIG. 2 shows a cross-sectional view of a first alternative structure having field plates and a biasing circuit, according to embodiments of the disclosure.

Referring to FIG. 2, an integrated circuit 200 is shown that includes the same device 104 as described with integrated circuit 102 (FIG. 1), but with an alternative biasing circuit 202. Similar to the embodiment of FIG. 1, three high voltage depletion mode transistors 140, 142, 144, each having a different pinch-off voltage, are coupled to a respective field plate 130a, 130b, 130c. Similarly, the pinch off voltage for each transistor 140, 142, 144 increases as the distance from the gate 132 increases, so transistor 140 has the lowest pinch off voltage Vpinch1 and transistor 144 has the highest pinch off voltage Vpinch3, i.e., Vpinch1<Vpinch2<Vpinch3. In this embodiment, each transistor 140, 142, 144 is coupled with a low voltage depletion mode transistor 210, 212, 214, respectively, and a respective resistor having a common resistance R. The low voltage depletion mode transistors 210, 212, 214 degenerate the biasing circuit 202 with lower leakage current. Accordingly, in this embodiment, the field plates are further biased by low voltage depletion mode transistors in combination with the high voltage depletion mode transistors.

In an example where each low voltage depletion mode transistor 210, 212, 214 has a common pinch off voltage $Vpinch_L$, a total leakage current of $((3*Vpinch_L)/R)$ results. Because $Vpinch_L$ is lower than that of Vpinch1, Vpinch2, and Vpinch3, the leakage current is accordingly further limited relative to the embodiment of FIG. 1.

In the embodiments of FIG. 1 and FIG. 2, each high voltage depletion mode transistor has a different pinch-off voltage based on a distance of the respective field plate from the gate to provide a biasing scheme in which the voltage applied to each field gate increases as the distance from the gate increases. Further, in these embodiments, a set of resistors, each coupled between a source of the semiconductor device and a respective high voltage depletion mode transistor, provide further biasing for the field plates.

Figure 3:
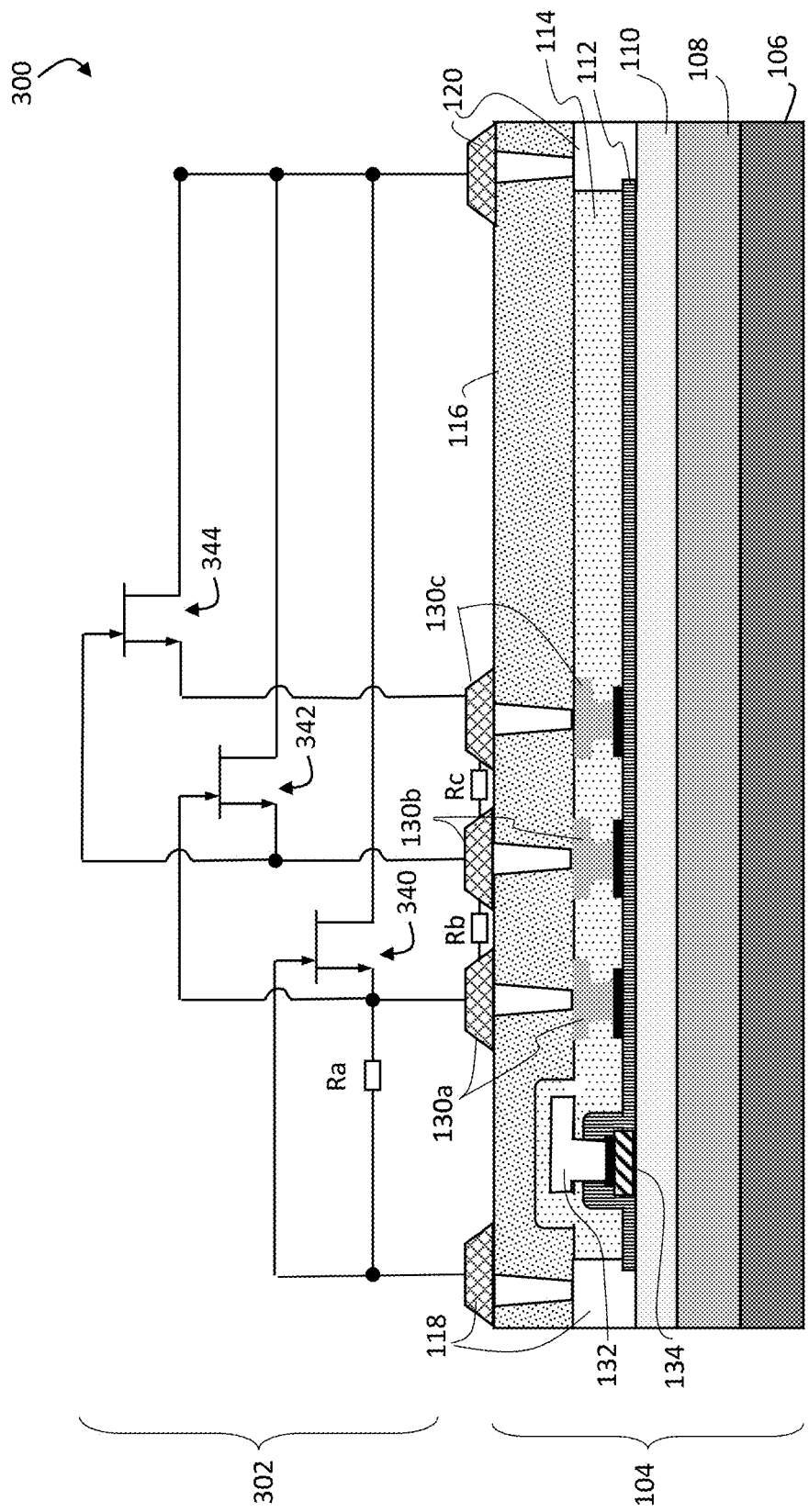
FIG. 3 shows a cross-sectional view of a second alternative structure having field plates and a biasing circuit, according to embodiments of the disclosure.

Referring to FIG. 3, an integrated circuit 300 is shown that includes the same device 104 as described with integrated circuit 102 (FIGS. 1 and 2), but with a second alternative biasing circuit 302. In this embodiment, each high voltage depletion mode transistor 340, 342 and 344 has the same pinch off voltage $Vpinch_H$ (e.g., 20V). Additionally, field plates 130a and 130b are coupled with a resistor Rb, and field plates 130b and 130c are coupled with resistor Rc.

Accordingly, in this embodiment, the field plates are independently biased by high voltage depletion mode transistors with a common pinch off voltage, and are further biased by resistors coupled between adjacent field plates to create different biasing voltages at each field plate.

This configuration likewise results in an increasing higher voltage at each field plate moving away from gate 132. For example, if $Vpinch_H=20V$, then field plate 130a has a voltage of 20V, field plate 130b has a voltage of 40V, and field plate 130c has a voltage of 60V. In this case, the total leakage current is $((Vpinch_H/Ra)+(Vpinch_H/Rb)+(Vpinch_H/Rc))$.

It is understood that the pinch-off voltages for the depletion mode transistors described in the above embodiments are for illustrative purposes only, and values may differ depending on the requirements of the device. Furthermore, in the above biasing circuits 102, 202, 302, the high voltage depletion mode transistors utilize n-type devices with drains coupled to the drain of the semiconductor device 104. Similarly, the described low voltage depletion mode devices (FIG. 2) use n-type devices. However, it is understood that the particular implementations are not intended to be limiting, and other arrangements and device types could be utilized to achieve similar biasing schemes.

Any methodology can be utilized to fabricate an integrated circuit structure having field plates and a biasing circuit as described above. Resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit, comprising:
a semiconductor device having a gate and a drain;
a plurality of field plates between the gate and drain; and
a biasing circuit electrically coupled to each of the plurality of field plates, the biasing circuit including a plurality of high voltage depletion mode transistors coupled to the drain of the semiconductor device;
wherein the high voltage depletion mode transistors have different pinch off voltages, and each of the field plates are each independently biased by a different one of the high voltage depletion mode transistors; and
wherein the field plates are further biased by low voltage depletion mode transistors in combination with the high voltage depletion mode transistors.

2. The integrated circuit of claim 1, wherein the field plates are further biased by resistors in combination with the high voltage depletion mode transistors.

3. The integrated circuit of claim 1, wherein the pinch off voltage applied to each field plate is increasingly greater as a distance from the field plate to the gate increases.

4. The integrated circuit of claim 1, wherein the low voltage depletion mode transistors have a common pinch off voltage.

5. The integrated circuit of claim 4, wherein the field plates are further biased by resistors coupled between adjacent field plates.

6. The integrated circuit of claim 1, wherein the semiconductor device comprises a gallium nitride (GaN) device.

7. The integrated circuit of claim 6, wherein the semiconductor device comprises an enhancement mode device with a p-type doped GaN layer.

8. The integrated circuit of claim 6, wherein the field plates include structures formed within a passivation layer, above a surface passivation layer of an aluminum gallium nitride layer.

9. A biasing circuit for a semiconductor device having a plurality of field plates between a gate and a drain of the semiconductor device, comprising:
a set of high voltage depletion mode transistors, each coupled to and biasing a respective field plate, and each having a different pinch-off voltage based on a distance of the respective field plate from the gate; and a set of resistors, each coupled between a source of the semiconductor device and a respective high voltage depletion mode transistor.

10. The biasing circuit of claim 9, wherein the pinch-off voltage for each high voltage depletion mode transistor increases as the distance from the gate increases.

11. The biasing circuit of claim 10, wherein the field plates are further biased by a set of low voltage depletion mode transistors, each low voltage depletion mode transistor being coupled to a respective one of the high voltage depletion mode transistors.

12. The biasing circuit of claim 9, wherein the semiconductor device is an enhancement mode n-type device, and each of the high voltage depletion mode transistors comprises an n-type device.

13. The biasing circuit of claim 12, wherein each high voltage depletion mode transistor comprises a drain coupled to the drain of the semiconductor device.

14. The biasing circuit of claim 11, wherein the semiconductor device is an enhancement mode n-type device, and each of the low voltage depletion mode transistors comprises an n-type device.

15. The biasing circuit of claim 9, wherein a gate of each high voltage depletion mode transistor is coupled to a source of the semiconductor device.

16. An integrated circuit, comprising:
a semiconductor device having a gate and a drain;
a plurality of field plates between the gate and drain; and
a biasing circuit electrically coupled to each of the plurality of field plates, the biasing circuit including a plurality of high voltage depletion mode transistors coupled to the drain of the semiconductor device, each having a pinch off voltage;
wherein the semiconductor device comprises a gallium nitride (GaN) enhancement mode device having a p-type doped GaN layer.

* * * * *